United States Patent
Goderis et al.

(10) Patent No.: US 8,500,976 B2
(45) Date of Patent: Aug. 6, 2013

(54) ROTATABLE SPUTTERING MAGNETRON WITH HIGH STIFFNESS

(75) Inventors: Parsifal Goderis, Oudenaarde (BE); Ivan Van De Putte, Roeselare (BE)

(73) Assignee: Soleras Advanced Coatings BVBA, Deinze (BE)

( * ) Notice: Subject to any disclaimer, the term of this patent is extended or adjusted under 35 U.S.C. 154(b) by 225 days.

(21) Appl. No.: 12/992,020

(22) PCT Filed: May 6, 2009

(86) PCT No.: PCT/EP2009/055486
§ 371 (c)(1),
(2), (4) Date: Nov. 10, 2010

(87) PCT Pub. No.: WO2009/138348
PCT Pub. Date: Nov. 19, 2009

(65) Prior Publication Data
US 2011/0062022 A1 Mar. 17, 2011

(30) Foreign Application Priority Data
May 16, 2008 (EP) .................................... 08156347

(51) Int. Cl.
*C23C 14/35* (2006.01)
(52) U.S. Cl.
USPC ............. 204/298.21; 204/298.12; 204/298.22
(58) Field of Classification Search
USPC ............................ 204/298.12, 298.21, 298.22
See application file for complete search history.

(56) References Cited

U.S. PATENT DOCUMENTS

| 4,422,916 | A | * | 12/1983 | McKelvey | ............... 204/192.12 |
|---|---|---|---|---|---|
| 4,904,362 | A | * | 2/1990 | Gaertner et al. | .......... 204/192.12 |
| 5,262,032 | A | | 11/1993 | Hartig et al. | |
| 5,571,393 | A | | 11/1996 | Taylor et al. | |
| 7,879,210 | B2 | * | 2/2011 | Inagawa et al. | ............. 204/298.2 |
| 2005/0178662 | A1 | | 8/2005 | Wurczinger | |
| 2006/0000705 | A1 | * | 1/2006 | Hartig et al. | ............. 204/192.12 |
| 2007/0089982 | A1 | | 4/2007 | Richert et al. | |
| 2007/0089985 | A1 | | 4/2007 | Schmidt et al. | |
| 2007/0089986 | A1 | | 4/2007 | Richert et al. | |

FOREIGN PATENT DOCUMENTS

| WO | WO 03/015124 A | 2/2003 |
|---|---|---|
| WO | WO 2004/061894 A1 | 7/2004 |
| WO | WO 2005/005682 A | 1/2005 |

* cited by examiner

*Primary Examiner* — Rodney McDonald
(74) *Attorney, Agent, or Firm* — Foley & Lardner LLP (57) ABSTRACT

A sputtering magnetron (300) insertable in a rotatable target is described. The magnetron is designed around a single piece, multiwalled tube (102, 202) with compartments (316, 316', 318, 318') extending over the length of the tube. The multiwalled tube gives a much stiffer magnetron carrier structure compared to prior art magnetrons. As a result, the magnetic field generator can be mounted inside a compartment and the distance between magnets and target surface is easily adjustable as the tube is much stiffer than the generator. Additionally, the coolant channels can be incorporated inside the tube and close to the outer wall of the tube so that coolant can be supplied in the vicinity of the magnetic field generator. The increased stiffness of the magnetron allows the target tube to be carried by the magnetron—not the other way around—at least during part of the useful life of the target. As a result thin target carrier tubes can be used as they don't have to carry the magnetron anymore resulting in a longer use of the target.

12 Claims, 4 Drawing Sheets

ROTATABLE SPUTTERING MAGNETRON WITH HIGH STIFFNESS

TECHNICAL FIELD

The invention relates to sputtering magnetrons as used with rotatable targets in apparatus for coating large areas such as display coaters, large area glass coaters, web coaters or a similar kind of equipment.

BACKGROUND ART

Physical vapour deposition by means of sputtering has become a standard technique to customise the properties of glass panes or other transparent materials. 'Sputtering' refers to the ballistic ejection of coating material atoms out of a target by means of positively charged ions of a heavy noble gas—usually argon—that are accelerated by an electric field towards a negatively charged target. The positive ions are formed by impact ionisation in the low pressure gas phase. The ejected atoms impinge with high kinetic energy on the substrate to be coated where they form a dense, well adhering coating.

The ionisation of the noble gas is confined close to the surface of the target by means of a magnetic field generated from within the target and exhibiting an arc shaped, closed loop tunnel at the surface of the target. During operation, electrons bounce back and forth along those magnetic field lines while drifting down the closed loop thereby increasing the impact ionisation of the noble gas atoms. A purple glowing closed loop 'race track' forms at the surface of the target.

It remains an engineering challenge when one wants to use cylindrical, rotating targets instead of the easier to implement planar stationary targets. When using the latter the coolant supply (the target must be cooled as the impact of the positive ions heats up the target) and electrical energy supply can be done to a fixed target assembly. When using rotating targets the coolant and electric supply must be rotational compliant while maintaining vacuum integrity. However, the benefits of succeeding in this challenge are worth the effort as rotatable targets carry much more usable target material stock than planar targets do. Also rotatable targets are less prone to arcing compared to their planar counterparts. These advantages are particularly appreciated in inline coaters wherein substrates pass by the elongated, cylindrical target in a direction perpendicular to the axis of the target. In order to maintain even coating thicknesses across the substrate a uniform sputter rate of target material is needed over the length of the target.

One of the engineering problems one is faced with is that the magnetic field generator must be contained in the target. The magnetic field generator—oriented towards the substrate to be coated—is usually held stationary while the cylindrical target rotates in front of it. High performance permanent magnets based on iron neodymium boron (Fe—Nd—B) or cobalt samarium (Co—Sm) alloys are used to generate the magnetic field. As the component of the magnetic field parallel to the surface of the target is determining the confinement of the electrons in the plasma it is important that this component is constant along the length of the tube. Unfortunately, the magnetic induction (in tesla) of this component normally drops with at least the second power of the distance to its generator and hence is very sensitive to the position of the magnetic field generator with respect to the target surface. The distance between the target surface and the magnetic field generator must therefore be well controlled as otherwise the plasma would show local variations in intensity that in their turn can lead to non-uniform coating profiles across the substrate. In what follows this will be called the 'distance control problem'.

Most of the energy supplied to the target is converted into heat that is generated at the surface of the target. This heat must be carried away efficiently, as otherwise the target would heat up too much and the magnets of the field generator would loose their strength at higher temperatures leading to a 'cooling problem'. Therefore a cooling circuit must be provided with a coolant that is normally water conditioned for the purpose. Unfortunately, the high performance magnets tend to corrode very fast and therefore they must be sealed from the coolant ('the sealing problem')

A number of solutions to the 'cooling problem' have been described in the prior-art. There is e.g. U.S. Pat. No. 5,262,032 that describes cooling of the magnets only. Or there is US 2005/0178662 that describes a system that provides for a radial exit of the coolant in the vicinity of the magnet.

A more comprehensive design attempt that seeks to solve at least two of the three problems mentioned above is U.S. Pat. No. 5,571,393 (Viratec thin films Inc.) wherein the magnet array is enclosed in a sealed magnet cavity part of a magnet housing made of two shells that are bolted together. The distance between target surface and magnet array is controlled through a pair of adjustable rollers mounted sideways of the magnet cavity and rolling against the inner side of the target. The coolant is fed from the one end of the magnetron through a central tube towards the other end and returns in axial direction in the gap between magnet housing and the target tube towards the one end. The disadvantage of this approach is that the coolant gets hotter and hotter as it nears the one end and hence leads to a gradient in temperature on the target and the magnet that on its turn leads to a gradient in deposition rate.

Another design can be found in WO 03/015124 (Bekaert Advanced Coatings). There the use of distance adjustment devices are described that set the distance between the target and the magnet array by locally deflecting the magnet field generator relative to a support structure. The support structure consists of the supply tube and a reinforcement element attached thereto. The element is filled with hard foam to increase its buoyancy in the coolant. The magnet array is sealed from the coolant by a magnet housing. The housing increases the stiffness of the magnet system thereby increasing the stresses on the support structure when the adjustment devices are used to set the distances between magnet array and target. Again the coolant flow is substantially axial from the one end of the target to the other end leading to a temperature gradient.

In a recent attempt to eliminate still water zones, bubble formation and improve the circulation of the coolant a series of US publications 2007/0089982, 2007/0089985, and 2007/0089986 describe the use of baffles to induce turbulence and of vanes to induce circulation into the cooling water. In addition the use of a rectangular shaped carrier tube to which the magnet array is attached is claimed for decreasing the bending of the magnet array.

WO 2005/005682 discloses a central body for mounting inside a rotatable target that incorporates—over and above the magnet array—means for bearing the target tube, rotating the tube, electrically contacting the tube and sealing the inside of the tube from coolant and vacuum. However, neither the magnet array is sealed from the coolant nor are adjustment devices provided to adapt the magnetic field. The use of this magnetron is limited to smaller scale installations.

DISCLOSURE OF INVENTION

According a first aspect of the invention, a sputtering magnetron is presented that solves the three problems mentioned: the distance control problem, the cooling problem and the sealing problem.

Another aspect of the invention concerns a target designed to cooperate with the sputtering magnetron.

Within the scope of this application a 'magnetron' is to be understood as a device that is inserted into the target tube and that is held by one or two end blocks in a fixed position relative to the end blocks. It comprises at least a magnetic field generator, hence its name. The inventive magnetron comprises a tube on or in which all necessary functional means are foreseen. Special about this tube is that it has several compartments axially oriented over substantially the whole length of the tube. The compartments are separated from one another by multiple inside walls extending over substantially the whole length of the tube. The walls are preferentially oriented parallel to the bending plane of the tube. The tube is made in one piece: it is not assembled out of demountable parts. Due to this monolithic structure and the presence of different internal walls, the tube is extremely stiff while being light.

The concept of a stiffness modulus $\epsilon$ ('stiffness' in short, expressed in Nmm$^2$) is well-known to the mechanical engineer:

$$\epsilon = \rho(x) \cdot M(x) = E \cdot I_y$$

wherein

E is the Youngs modulus of the material used (in N/mm$^2$)

$I_y$ is the geometrical moment of the tube in the direction of bending 'y' (in mm$^4$) i.e.

$$I_y = \iint y^2 dA$$

the domain of the integral being taken over the perpendicular cross section of the tube M(x) is the local bending moment at place 'x' along the length of the tube $\rho(x)$· is the local radius of curvature at 'x' resulting from the bending moment M(x).

In the state-of-the-art CAD software available today it can be calculated numerically to great precision.

Inside these elongated compartments, different functional means can be mounted. As a minimum the elongated magnetic field generator is mounted in one of said compartments. In that way it is shielded from the coolant thus countering the 'sealing problem'. The elongated magnetic field generator is in its crudest form a bar of ferromagnetic material (such as iron) onto which high-performance magnets are mounted in such a way that an elongated closed racetrack forms determined by the arcuate magnetic field lines forming at the surface of the target. In order to have a strong magnetic field close to the target, the magnetic field generator is mounted into a compartment as close as possible to the target, i.e. one of the compartment walls is part of the outer tube wall. One or more of the other compartments can be used as a coolant feed or coolant extraction channel.

The tube itself is preferably made out of a material with a high modulus in order to increase the stiffness. By preference this is a metal or a metal alloy although certain high performance plastics (such as Flametec™ Kytec® PVDF (polyvinylidene fluoride) or ECTFE (a copolymer of ethylene and chlorotrifluoroethylene) and even ceramics are not excluded. Additionally the metal or plastic tube can be reinforced with high grade fibres wound into or onto the tube and consolidated therewith. For example carbon fibre can be used for this purpose. By adjusting the winding angle of the fibre the thermal expansion can be matched to that of the tube. Or in case a high performance plastic is used, the winding can be adjusted so that thermal expansion is minimised. It is of course preferred that the material is not or very little magnetic (relative magnetic permeability $\mu_r$ close to 1) because the magnetic field lines have to penetrate the outer wall of the tube.

The tube can be formed by means of different processes, e.g. by welding the walls together, or by starting from a solid piece and milling or drilling the compartments out of the tube, or by casting the piece, or by extrusion. Most preferred is that the tube is formed by extrusion of an aluminium alloy such as Duraluminium, an alloy of aluminium, copper, manganese and magnesium (in respective proportions by weight of 95.5/3/1/0.5).

An adjustable mounting of the magnetic field generator makes it possible to adjust the distance between the magnetic field generator and the tube outer wall inside its compartment. As the stiffness of the tube is now much higher than the stiffness of the magnetic field generator, it is much easier to bend the latter while the former remains substantially straight. In addition—as it is already protected from the coolant in its compartment—the magnetic field generator can be made very flexible as no protective housing will increase its stiffness. The adjustment of the distance between tube and generator therefore does not involve large bending forces that would make adjustment more difficult. As the tube is now more rigid, it provides a stable basis to adjust the magnetic field generator relative to the outer wall of the tube and hence relative to the outer target surface which is important for adjusting the magnetic field strength at the surface of the target.

If it comes down to numbers, it is preferred that the stiffness of the tube is at least three times the stiffness of the magnetic field generator. Even more preferred is that it is at least five times stiffer. The magnetic field generator must still have sufficient stiffness so as not to hang through or to be too flexible when being adjusted.

Adjustment of the distance of the magnetic field generator with respect to the outer wall of the tube is enabled by discrete supports distributed over the length of the tube. The distance between the supports determines the detail by which local adjustments can be made: when only three supports are present (at the first end, in the middle, and at the second end) only a general but smooth bow can be applied on the magnetic field generator in either half of the magnetic field generator. When more supports are present, the adjustment can be made more locally, but this can lead to too many adjustment positions.

When the supports are adjusted, some longitudinal movement, i.e. parallel to the axis of the target, between the magnetic field generator and the support must be possible at the connecting point between support and magnetic field generator as otherwise the bending forces on the tube will be increased when adjustments are being made.

Such an longitudinally movement compliant connection between support and magnetic field generator is for example an elongated slot—in the axial direction of the target—in which a catch is inserted and locked into position by a quarter turn. Only axial movement then is possible no angular movement (with angular movement is meant movement tangential to the center of the magnetron tube). The middle support is arranged oppositely: the slot is perpendicular to the axial direction of the target and when locked by the latch no axial movement is possible (otherwise the generator could be axially moved in its entirety).

This is just one way of making such a movement possible. Other possibilities are to use a hinge mount at either end of the support: the end that connects to the generator and the end that connects to the tube. However, such arrangement is less preferred as it is more complex.

The adjustment mechanism to change the distance between outer tube wall and generator can be diverse, from simple to more complex. Mechanical systems are straightforward. The simplest is to introduce shims or washers over a screw that holds the support in place to increase the overall length of the support. Another is to introduce an adjustment screw in the support where the screw turns in a threading fixedly connected to the tube while the end of the screw is axially held by a holder connected to the generator in which it can freely turn. Alternatively, the threading in the support can be fixed to the generator, while the screw turns without displacement in a holder connected to the tube. The latter is preferred because the screw protrusions outside the tube do not change upon adjustment. Another possibility is wedge sliders that transform a large linear movement in one direction into a small but accurate displacement perpendicular to the movement.

Electrical actuators such as electromagnetic motors, piezoelectric motors, or other electromagnetic means are also preferred possibly in combination with mechanical adjustment means. For example piezoelectric motors e.g. allow for a very precise movement through an electrical control. The combination with mechanical adjustment is also possible whereby for example the rough tuning is done mechanically e.g. by means of washers while the fine tuning is done electromechanically. Another combination is wherein mini electromagnetic motors drive mechanical set screws.

Even hydraulic or pneumatic adjustable actuators could be considered in the support that are based on simple piston in tube systems or based on liquid (or air) actuated springs (essentially a small balloon in a cylinder).

It is advantageous to be able to control the adjustment distance from the outside (the 'outside' being outside the pressure vessel wherein the magnetron operates). The magnetron then not longer has to be opened in order to adjust distances. As an option, the adjustment of the position of the magnetic field generator can be based on a process status indicator. Such status indicator can e.g. be a feedback signal from the support that indicates its position relative to the outer wall of the tube, or can be based on a measurement of the magnetic field at the target surface. The status indicator can also be collected during operation of the magnetron e.g. by PEM (Photo Emission Monitoring).

Feedback can be given through actuating lines mechanically (through push-pull or flexible shaft arrangements), electrically (through electrical cables or a busbar) or hydro-pneumatically (through tubing). These actuating lines can conveniently be guided through one of the available compartments in the tube to the outside of the magnetron.

Another inventive feature of the multi-walled tube magnetron design concerns the cooling problem. By using one or more of the compartments—preferably one adjacent to the outer wall—coolant can be fed over the length of the magnetron. Contrary to existing systems (where the coolant first goes to the end before making a U-turn) in this system, the coolant is injected in the gap between tube and target through exit holes in said compartments over the whole length of the magnetron. This leads to a substantially tangential coolant flow in front of the magnetic field generator i.e. there where most of the heat is generated hence most cooling is needed.

The positioning of the exit holes leaves many degrees of freedom that can be changed in order to obtain an effective cooling. The spacing between exit holes can be varied, the angular position can be varied (within the angular width of the cooling channel compartment of course), the flow rate can be changed by e.g. changing the aperture of the holes, the injection direction can be changed by changing the orientation of the holes relative to the local radius.

The spacing between the exit holes should take into account the pressure drop that occurs over the line as coolant exits along the channel. Therefore it may be needed to decrease the distance between exit holes with the flow direction of the coolant in order to keep the coolant flow rate constant over the length of the magnetron.

Another adaptation may be to adjust the angular position between the exit holes and the generator as seen from the centre of the magnetron. This can be done within boundaries of the angular segment taken up by the coolant channel. Exit holes could be positioned closer to the generator when the coolant goes down the flow. Or they could be alternatingly positioned closer and farther from the generator.

Another degree of freedom is that the aperture of the holes can be adjusted to ensure an appropriate coolant flow over the length of the magnetron. This can be done taking into account of the pressure drop over the length of the magnetron. Intuitively one expects that the aperture should be larger the further away from the coolant entry side, but this can also be reversed if the distance between the exit holes is adapted.

The exit holes are preferably close to the compartment zone occupied by the magnetic field generator as there most of the cooling is needed.

The exit orientation of the holes can be varied too e.g. by drilling them more in line with the relative movement between target and tube towards the end of the coolant channel. Normally the holes can be oriented radially away from the centre of the tube. However, more preferred is that the exit flow orientation is inclined slightly against the relative movement between target and tube in order to obtain a better flow distribution.

In order to prevent the formation of still coolant zones where the coolant does not move, some turbulence can be induced in the flow of coolant between the target and the tube. This can be achieved by giving the outer surface of the tube a corrugated shape. The turbulence also results in better mixing of the coolant.

In the above the coolant is fed from one end of the magnetron into the coolant channel compartments and ejected out of the channels over the whole length of the magnetron. After tangentially passing in front of the magnetic field generator the coolant flows axially towards the coolant collecting endblock. There it is extracted out of the magnetron. Collection of the coolant can also be done by another compartment of the tube, thereby creating a more effective drain. This can be done through holes in the outer wall of this collection channel for example. Alternatively, the tube may be provided with a longitudinal indentation in its outer wall. The coolant will by preference take this route to the coolant collecting end-block.

The increased stiffness of the magnetron through the use of one multiwalled, solid carrier tube brings some other inventive aspects with it for the target itself. A target normally comprises a target tube (not to be confused with the magnetron tube) whereon target material has been disposed. Hitherto this target tube had to have a considerable wall thickness because it is used to carry the magnetron from the inside (as in the designs according U.S. Pat. No. 5,571,393 or WO 2004/061894). With 'to carry' is meant 'to move while opposing gravitational forces'. So the magnetron transfers its weight to the target tube. In the alternative design according WO 03/015124, the target tube must be stiff—hence thickwalled—in order not to transfer its weight to the magnetron that would bend under the weight. In this design the target tube and magnetron do not touch each other).

By making now the magnetron stiffer it becomes possible to seriously reduce the thickness of the target tube so that it can actually be carried by the magnetron in stead of the magnetron being carried by the target. While initially the stiffness of the whole target may be larger than the stiffness of the magnetron tube due to the presence of the sputtering material, this stiffness will gradually decrease as the sputtering material is eroded away. Ultimately the target will sag and become carried by the magnetron. While in the previous designs the magnetron could not cope with this weight of the bent-through target, the current design can.

In other words, the design opens a whole new way of supporting a target in a rotatable target magnetron operation, namely a design wherein the target tube with target material is carried by the magnetron, not the other way around, and this at least during part of the useful life of the target. Preferably, it will be at the end of the useful life of the target that it will be carried by the magnetron. It suffices to make the magnetron sufficiently stiff so that it can carry the target that comprises the target tube and the target material. The target tube can then be made much thinner than is currently allowed.

In order to reduce the friction that occurs between the inner wall of the target tube as the target tube starts to weigh on the magnetron, bearing means must be introduced between the magnetron tube and the target tube. These bearing means can e.g. be achieved by low friction slide pieces made of Teflon® or similar materials. In case the sliding pieces extend over substantially the whole length of the tube, additional friction reduction can be obtained by injecting coolant through exit holes into the space formed by the magnetron tube, the sliding pieces and the interior of the target tube. Alternatively rollers or ball bearings can be fixed in the outer wall of the magnetron tube. Possibly the rollers are adjustably mounted so as to be able to change the distance between the inner target tube wall and the outer magnetron tube wall.

A rotatable target comprises a target tube made of a non-magnetic material such as stainless steel and target material disposed thereon. The above invention brings with it a completely new and inventive rotatable target design wherein the target tube wall can be much thinner than the currently used heavy target tubes with wall thicknesses of 4 mm and more. Such target tubes readily have stiffnesses in excess of 700 $GNmm^2$. Indeed the combination of wall thickness and the material used for the target tube may allow stiffness of the target tubes below 600 $GNmm^2$, or even below 500 $GNmm^2$. The target tube wall can then be thinner than 3.8 mm e.g. 3.5 mm or 3.0 mm or even as thin as 2 mm for lengths of 1 meter or more. If the target is shorter than 1 meter, the thickness can even be reduced to 1 mm.

Thinner target tube walls bring some advantages:
- The magnetic field at the target surface will increase for the same target material thickness as the magnets can be situated closer to the target surface.
- Thermal stresses will decrease because due to the thin wall of the tube, the tube will yield more easily to the heat extension of the target material. Thick wall tubes resist more this thermal expansion leading to either extreme compressive stresses in the target material (leading to cracking) or delamination of the target material from the target tube.
- Better cooling efficiency results as less non-used material must be cooled.

Initially the target tubes will have a large stiffness due to the sputtering material disposed on it. As the target material depletes, the overall stiffness of the target will decrease until the target is carried by the magnetron, that now has sufficient stiffness to keep the whole functional. Hence, the inventive magnetron is particularly well suited to use such thin walled targets on.

BRIEF DESCRIPTION OF FIGURES IN THE DRAWINGS

In the figures the hundred digit refers to the number of the figure while the unit and the tens digit refer to corresponding features across figures.

Mode(S) For Carrying Out The Invention

Figure 1:
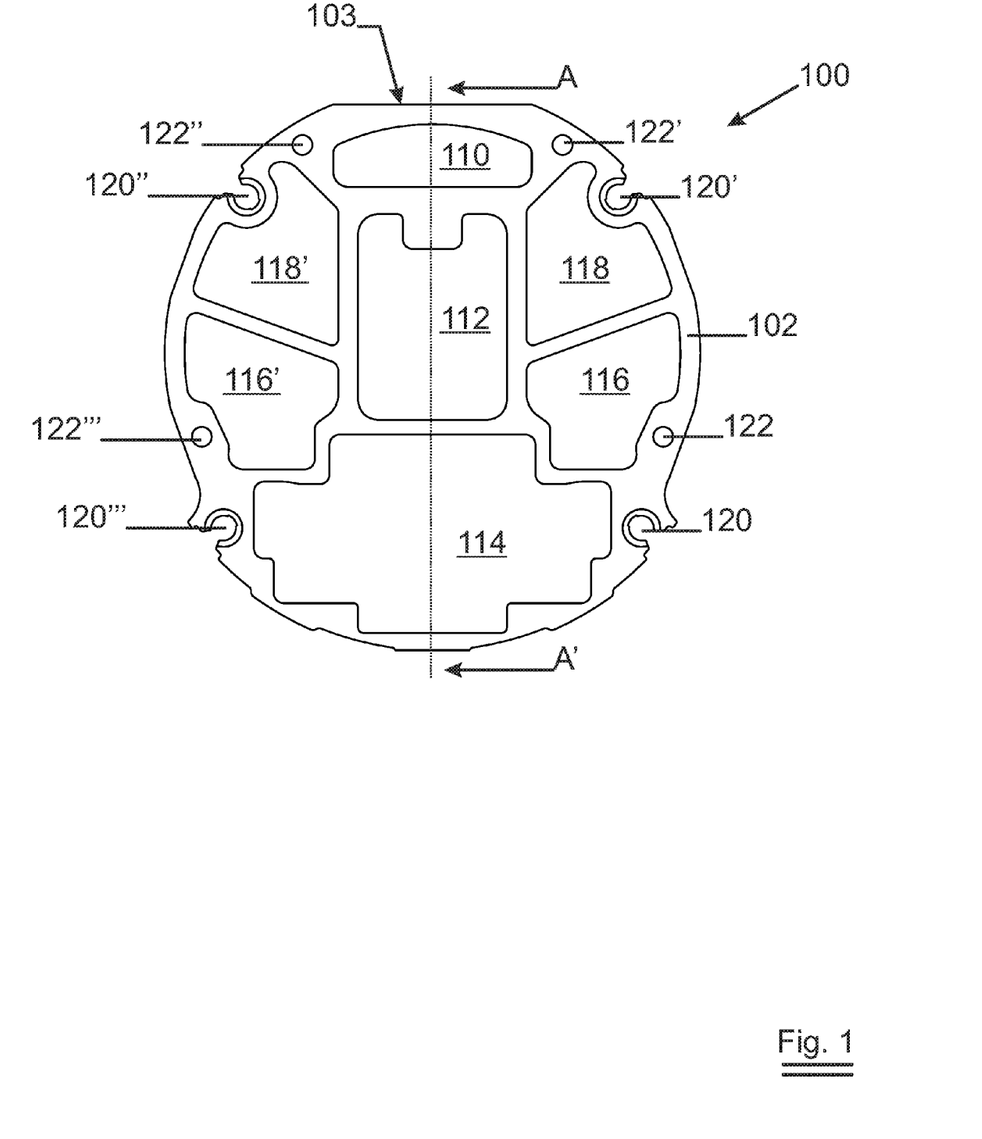
FIG. 1 shows a cross-section of an internally multi-walled tube without any other functional means attached.

FIG. 1 is a cross section of the tube 100 showing the extruded multi-walled tube of Duraluminium 102 which is in one single piece of material. In this particular embodiment the diameter of the tube is about 115 mm which fits into the interior of a 125 inner diameter target tube. Different compartments can be discerned that extend over the whole length of the magnetron tube: 114 will accommodate the magnet generator, 110 the adjustment mechanism for the supports. 112 will hold the support themselves. Compartments 118, 118', 116, 116' can be used for other purposes such as feeding and extraction of coolant, feed trough of tubing, cables or the like. The holes 122, 122', 122", 122'" are threaded holes (not extending over the entire length of the tube, only at either end of the tube) for receiving screws to fix the closure pieces (not shown). The tube is to be mounted such that bending occurs in the plane AA'.

When calculating the stiffness of the tube compared to the prior-art type of magnetron of WO 03/015124 one obtains the following data:

|  | Item | |
| --- | --- | --- |
|  | WO 03/015124 | This application |
| Material | Stainless steel | Duraluminium |
| Cross sectional area ($mm^2$) | 1 100 | 3 000 |
| Length (mm) | 3861 | 3861 |
| Own mass (kg) | 34.1 | 31.3 |
| Modulus ($N/mm^2$) | 210 000 | 70 000 |
| Stiffness (in $10^9$ $Nmm^2$) | 134 | 231 |
| Deflection (mm) | 3.23 | 1.07 |

'Deflection' is the sagging of the tube—inclusive the magnetic field generator—when supported only at its' ends. Although the Young's modulus of aluminium is only one third of that of the prior art stainless steel embodiment, the overall stiffness of the novel tube is almost the double while the weight is about the same. This is due to the increased geometrical moment of the cross section which on its turn is due to the multi-wall internal structure of the tube. The associated magnetic field generator has as stiffness of $131.10^6$ $Nmm^2$ which is very low compared to the stiffness of the tube. Hence, the tube will remain substantially straight upon adjustment of the generator.

Figure 2:
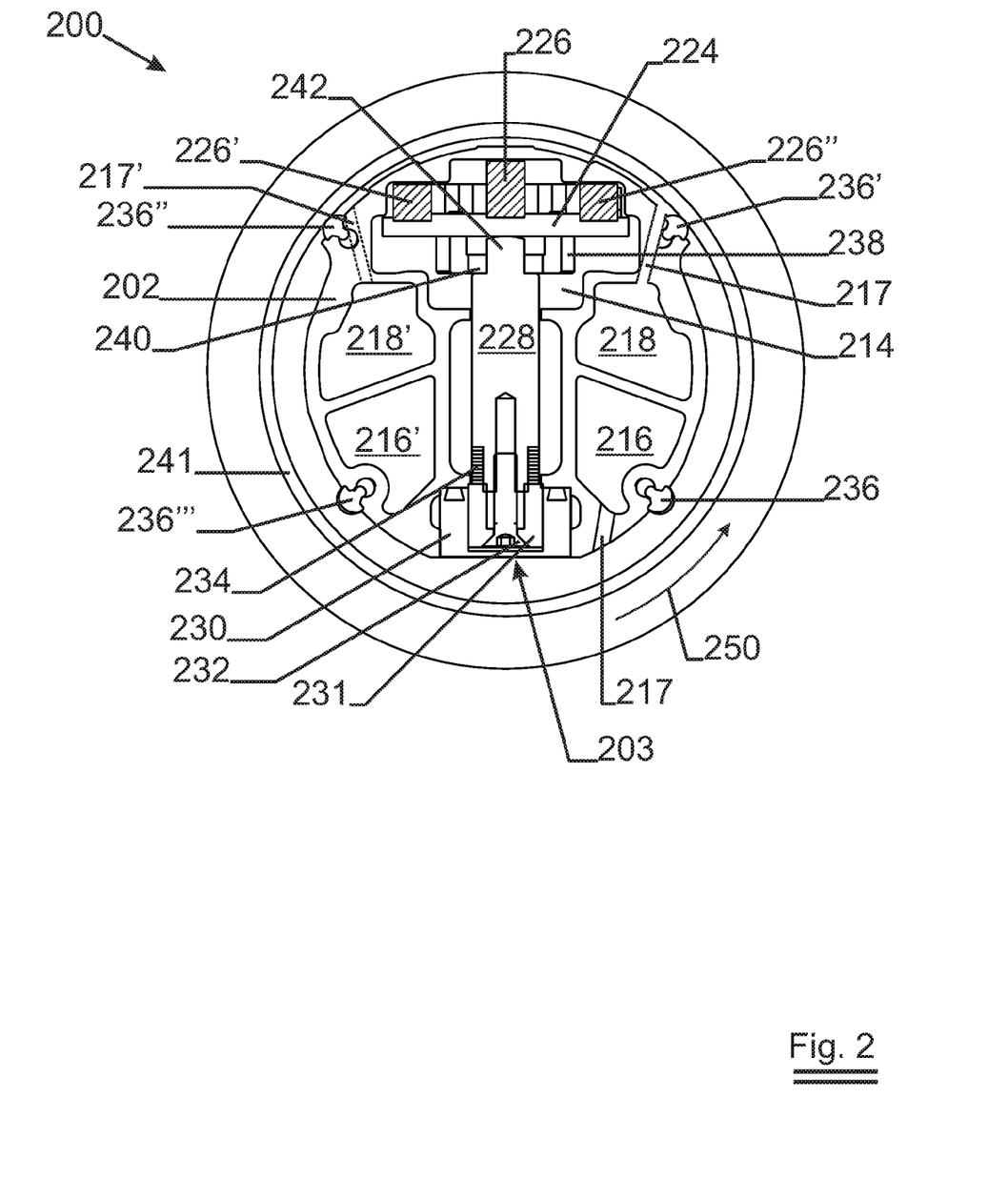
FIG. 2 shows a cross-section of the same tube but now with all other functional means mounted in or on the tube.
Figure 4:
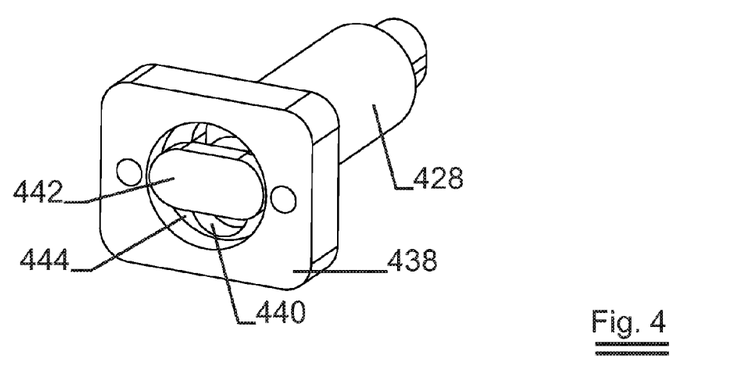
FIG. 4 shows how the slot and catch are matched.

FIG. 2 shows the complete magnetron 200 together with the target tube 241. A magnetic field generator is integrated into the tube in the compartment 214. It comprises a soft iron bar 224 on which permanent magnet pieces 226, 226' and 226" are mounted. On the bar 224 fixation pieces 238 are fixed by screws. The fixation pieces 238 have a slot 240 for receiving the catch 242 at the end of the support 228. The cross section is in the middle of the magnetron, hence the slot is oriented perpendicular to the axial direction of the tube. Note that for all other fixation pieces, the slot is oriented in the axial direction of the tube FIG. 4 shows how the slot and catch cooperate together. The fixation piece 438 has an elongated slot 440 in a recess 444 wherein the catch 442 at the end of the support 428 engages after being turned a quarter turn. There is sufficient play between the catch 442 and the fixation piece 438 in order to allow movement between support 428 and fixation piece 438 in the axial direction of the magnetron.

The distance between magnets 226, 226' and 226" and the wall of the tube 202 can be adjusted by increasing or decreasing the length of the support 228. At the end of the support 228 opposite to the catch 242 a series of washers 234 can be introduced between the support 228 and a positioning block 231 fixed with a bolt 232. The positioning block 231 itself is fixed with two (not shown) screws to the tube and is covered by a cover 230 with a sealing O-ring to prevent leakage of coolant into the generator compartment. The cover is also screwed to the tube. In total there are about 13 of such supports situated at regular distances along the length of the tube.

In an alternative embodiment (not shown) piezoelectric motors such as e.g. model SQ-115-N available from New Scale Technologies are integrated into the supports 228. Piezoelectric motors are particularly useful in this application because they can withstand heat reasonably well, do not outgas significantly and are not susceptible to magnetic fields. Their major drawback is the low force (about 5 N) they can hold, but due to the low stiffness of the magnetic bar this is not a problem. The motors are individually controllable through leads that are led through the central compartment 112.

The coolant is fed to the target through compartment 218 and 218'. The exit holes 217, 217' are situated close to the magnetic field generator 226, 226', 226". There are about 40 exit holes evenly distributed over the length of the magnetron. Due to this even distribution of coolant supply the temperature difference over the magnetron can be held within a range of about 5K at the level of the magnetic field generator. The collection of coolant is in the axial direction and is eased by the flat indentation 103, 203 extending over the length of the magnetron tube.

In order to prevent wear of the magnetron tube when it would come into contact with the inner side of the target tube, gliding strips 236, 236', 236" and 236'" made of Teflon®—a fluoropolymer available from DuPont™—are inserted into recesses on the outer side. Coolant exit holes 217, 217' jet coolant into the space formed by the outer magnetron tube wall, the inner target wall and the gliding strips 236', 236". As the coolant is forced through this space, additional friction reduction results as the coolant escapes through the gap between the gliding strips and the target tube. Alternatively the gliding pieces can be replaced by rollers. Such embodiments allow the target tube 241 to be extremely thin walled compared to the prior art tubes because the magnetron is strong enough to carry the tube when it begins to sag during the use of the target.

Figure 3:
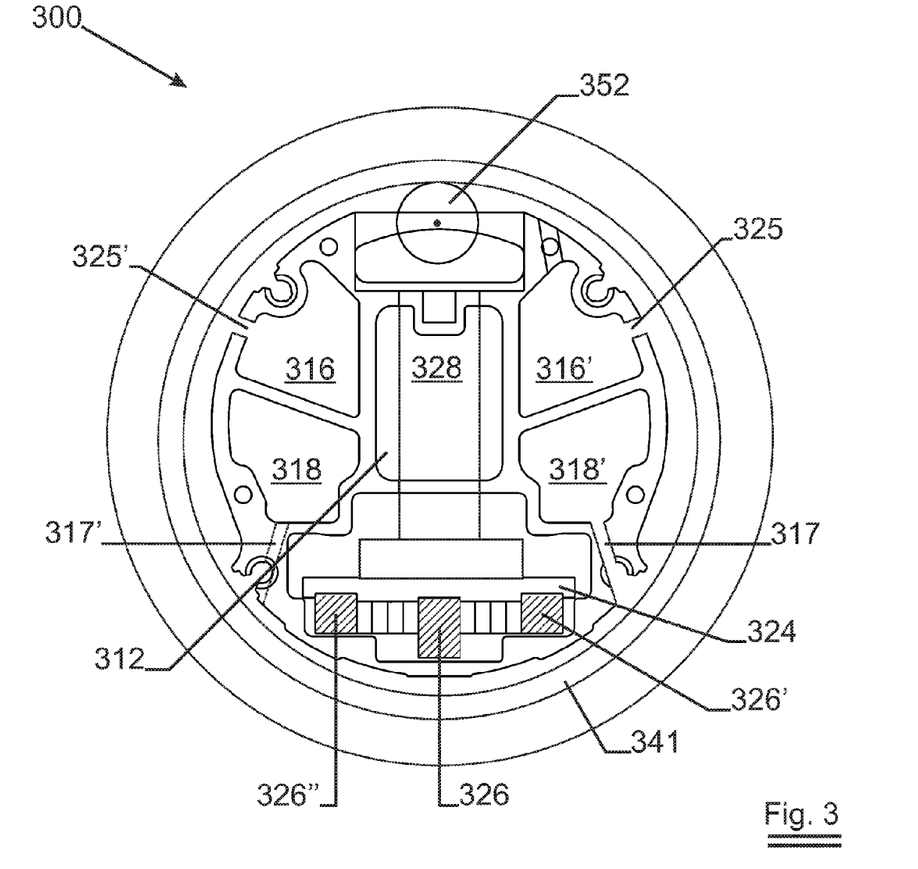
FIG. 3 shows a second preferred embodiment wherein the target tube is carried by the magnetron tube.

In further embodiment of the invention as shown in FIG. 3, the geometry has been reversed and the magnetron is directed downward. Rollers—of which one is shown as 352—are mounted in the wall of the tube opposite of the side where the magnetic field generator 326, 326' and 326" is situated. Particular about this embodiment is that the target tube 341 on which the target material is deposited can be made thin and is supported by the rollers 352. Different sets of rollers can be accommodated under different angles to the vertical. The rollers can also be made adjustable. Collection of the coolant is done trough holes 325 and 325' and return to the coolant collecting end-block is through channels 316 and 316'.

Figure 5:
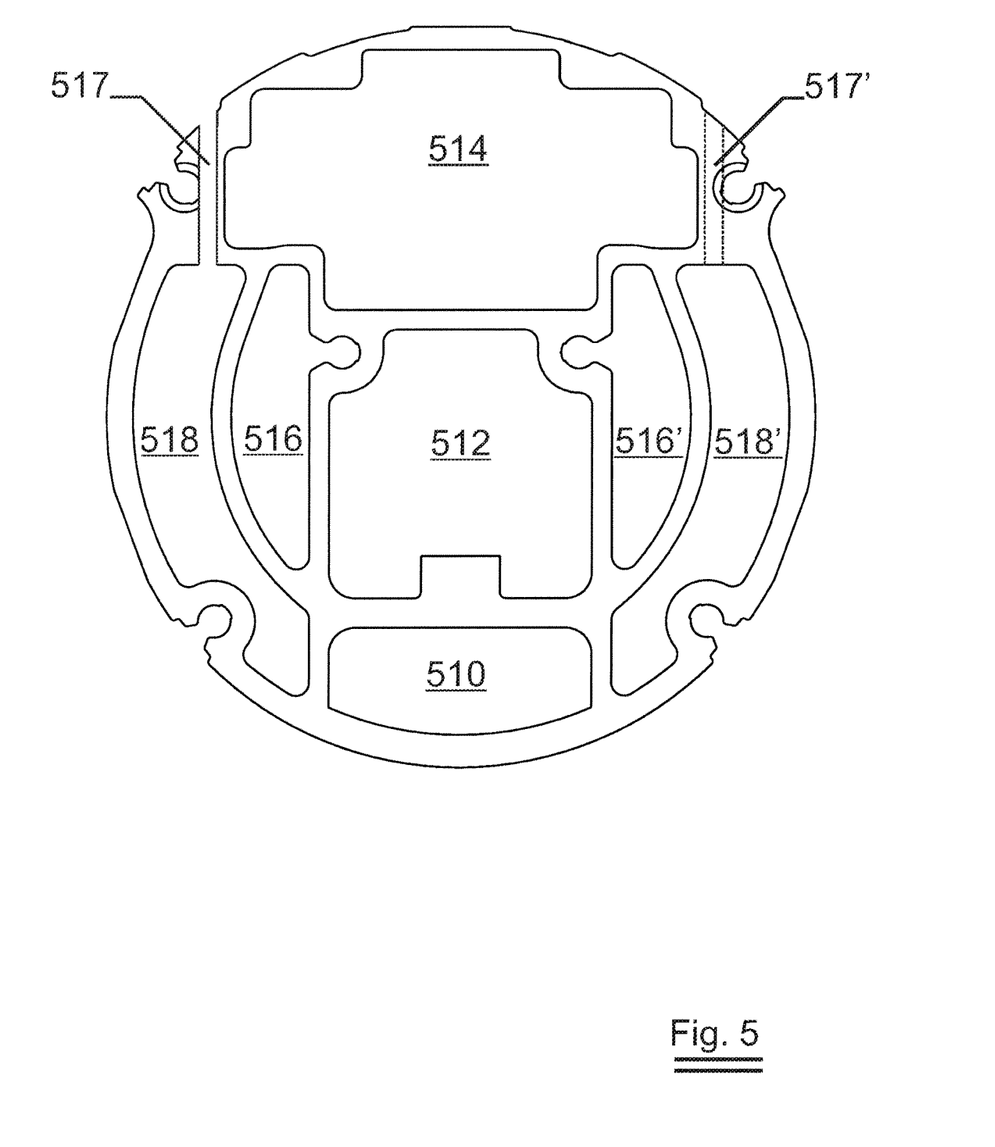
FIG. 5 show a third preferred embodiment with another arrangement of the compartments.

A third preferred embodiment is shown in FIG. 5. It differs from the other embodiments in that the cross-section shows another subdivision of the compartments. Now coolant channels 518, 518' are completely arranged at the circumference of the tube. Compartments 516 and 516' remain available for other uses (wiring, etc. . . . ). The advantage of this embodiment is that the tube on itself is more uniformly cooled as the compartments act as a cooling mantle. Also the available cross section for the cooling is larger than in the other embodiments. In addition, the interior walls of compartments are more parallel with the plane of bending, resulting in a higher bending stiffness.

The invention claimed is:

1. A sputtering magnetron insertable in a rotatable target comprising:
   a tube; and
   an elongated magnetic field generator,
   wherein said tube is a single piece, internally multiwalled tube,
   wherein said tube has at least first and second compartments, extending over substantially a whole length of said tube for increasing bending stiffness of said tube,
   wherein said magnetic field generator is integrated inside the tube in the first compartment, and
   wherein the second compartment forms a coolant channel incorporated inside the tube.

2. The sputtering magnetron according to claim 1 wherein said tube is one piece formed by extrusion or casting or milling or welding.

3. The sputtering magnetron according to claim 2 wherein said tube is formed by extrusion of an aluminium alloy.

4. The sputtering magnetron according to claim 1 wherein said magnetic field generator has a lower bending stiffness than the bending stiffness of said tube, and wherein said magnetic field generator is adjustably mounted inside the first compartment for adjusting a distance between said magnetic field generator and an outer wall of said tube.

5. The sputtering magnetron according to claim 1 further comprising discrete supports distributed over the length of said tube for adjusting distances between said magnetic field generator and an outer wall of said tube.

6. The sputtering magnetron according to claim 5 wherein said supports are configured to allow longitudinal movement of said magnetic field generator relative to said supports for ease of adjustment of said magnetic field generator.

7. The sputtering magnetron according to claim 5 wherein said supports are adjustable by mechanical, electrical, hydraulic or pneumatic means.

8. The sputtering magnetron according to claim 5 wherein said supports are mechanically adjustable by adjustable screw, by an adjustable sliding means, by shims, or by washers.

9. The sputtering magnetron according to claim 5 wherein said supports are adjustable from outside said magnetron responsive to a process status indicator.

10. The sputtering magnetron according to claim 1 wherein the second compartment is adjacent to an outer tube wall.

11. The sputtering magnetron according to claim 10 wherein said coolant channel has exit holes arranged lengthwise so as to permit a coolant flow between said tube and said target at least in front of said magnetic field generator so as to reduce friction between said target and said magnetron.

12. The sputtering magnetron according to claim 10 wherein a returning channel for collection and drain of the coolant is formed by a third compartment in said tube or by a longitudinal indentation in an outer wall of the magnetron extending over a length of said magnetron.

\* \* \* \* \*